United States Patent
Chang et al.

(10) Patent No.: US 8,659,456 B2
(45) Date of Patent: Feb. 25, 2014

(54) ELECTRONIC DEVICE AND TRANSMITTER DC OFFSET CALIBRATION METHOD THEREOF

(75) Inventors: Hsiang-Hui Chang, Miaoli County (TW); Hsin-Hung Chen, Hsinchu County (TW); Chi-Yun Wang, Tainan (TW); Chih-Jung Chen, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/610,808

(22) Filed: Sep. 11, 2012

(65) Prior Publication Data

US 2013/0141153 A1    Jun. 6, 2013

Related U.S. Application Data

(60) Provisional application No. 61/560,420, filed on Nov. 16, 2011.

(51) Int. Cl.
*H03M 1/10*    (2006.01)

(52) U.S. Cl.
USPC ........... 341/120; 375/221; 375/261; 375/270; 375/296; 375/346; 375/219; 375/298; 375/317; 455/232.1; 455/126; 455/109; 455/78; 455/323; 455/219; 455/127.2; 455/68; 455/73; 455/47

(58) Field of Classification Search
USPC .......... 341/118–155; 375/221, 261, 270, 296, 375/346, 285, 219, 298, 317; 324/79.06; 455/232.1, 67.16, 67.11, 47, 73, 68, 455/127.2, 219, 323, 78, 109, 126
See application file for complete search history.

(56) References Cited

U.S. PATENT DOCUMENTS

| | | | | |
|---|---|---|---|---|
| 5,404,143 A | * | 4/1995 | Distinti | 341/158 |
| 5,519,396 A | * | 5/1996 | Distinti | 341/153 |
| 6,456,223 B1 | * | 9/2002 | Yu et al. | 341/161 |
| 6,466,153 B1 | * | 10/2002 | Yu | 341/161 |
| 6,496,124 B1 | * | 12/2002 | Dagdeviren | 341/118 |
| 6,545,623 B1 | * | 4/2003 | Yu | 341/155 |
| 6,859,499 B2 | * | 2/2005 | Hashimoto | 375/240.27 |
| 6,952,567 B2 | | 10/2005 | Sowlati | |
| 7,248,625 B2 | | 7/2007 | Chien | |
| 7,295,820 B2 | * | 11/2007 | Shafeeu | 455/136 |
| 7,421,260 B2 | * | 9/2008 | Darabi | 455/130 |
| 7,486,114 B2 | * | 2/2009 | Chen et al. | 327/20 |
| 7,778,345 B2 | | 8/2010 | Sperlich | |

(Continued)

FOREIGN PATENT DOCUMENTS

KR    1020080095004    10/2008

*Primary Examiner* — Lam T Mai
(74) *Attorney, Agent, or Firm* — Winston Hsu; Scott Margo

(57) ABSTRACT

An embodiment of the invention provides an electronic device. The electronic device includes a digital-to-analog converter (DAC), a transmitter front-end (TX FE), an amplifier, an analog-to-digital converter (ADC), and a swap circuitry. The TX FE has a first and a second input end coupled to a first and a second output end of the DAC, respectively. The ADC has a first and a second input end coupled to a first and a second output end of the amplifier, respectively. The swap circuitry is configured to couple the first and second output ends of the DAC to a first and a second input end of the amplifier in a normal state, respectively, and couple the first and second output ends of the DAC to the second and first input ends of the amplifier in a swapped state, respectively.

14 Claims, 4 Drawing Sheets

(56) References Cited

U.S. PATENT DOCUMENTS

| | | | |
|---|---|---|---|
| 7,778,613 B2 * | 8/2010 | Seendripu et al. | 455/130 |
| 7,856,048 B1 | 12/2010 | Smaini | |
| 7,869,777 B2 * | 1/2011 | Darabi | 455/130 |
| 8,274,767 B2 * | 9/2012 | Fukuda | 361/18 |
| 8,462,028 B2 * | 6/2013 | Kashiwakura | 341/101 |
| 2007/0159162 A1 | 7/2007 | Kang | |
| 2007/0202814 A1 | 8/2007 | Ono | |
| 2007/0271054 A1 * | 11/2007 | Chen et al. | 702/85 |
| 2008/0139161 A1 | 6/2008 | Park | |
| 2009/0088101 A1 | 4/2009 | Agawa | |
| 2010/0233971 A1 | 9/2010 | Vassiliou | |

* cited by examiner

ELECTRONIC DEVICE AND TRANSMITTER DC OFFSET CALIBRATION METHOD THEREOF

CROSS REFERENCE TO RELATED APPLICATIONS

This application claims the benefit of U.S. provisional application No. 61/560,420, filed on Nov. 16, 2011 and incorporated herein by reference.

BACKGROUND

1. Technical Field

The invention relates generally to an electronic device, and more particularly, to the electronic device and a transmitter DC offset calibration method performed by the electronic device.

2. Related Art

To communicate with another electronic device, an electronic device such as a mobile phone, a tablet computer, a laptop computer, or a media player, can include a digital baseband circuitry, a digital-to-analog converter (DAC), and a transmitter front-end (TX FE). To put it simply, the digital baseband circuitry first generates a digital signal upon which transmission is based. Then, the DAC converts the digital signal into a baseband signal. Next, the TX FE up-converts the baseband signal to generate an RF signal, amplifies the RF signal, and passes the amplified RF signal to an antenna for transmission. For example, the TX FE may include the following components: a local oscillator (LO) for generating a carrier signal; a mixer for generating the RF signal by mixing the baseband signal with the carrier signal; and a programmable gain amplifier (PGA) for amplifying the RF signal.

An analog signal on the aforementioned transmission path may have some direct current (DC) offset. A small DC offset may be negligible; but if the DC offset is large, it may affect the communication quality. To prevent the communication quality from degrading, the DC offset must be calibrated properly.

SUMMARY

An embodiment of the invention provides an electronic device. The electronic device includes a digital-to-analog converter (DAC), a transmitter front-end (TX FE), an amplifier, an analog-to-digital converter (ADC), and a swap circuitry. The TX FE has a first and a second input end coupled to a first and a second output end of the DAC, respectively. The ADC has a first and a second input end coupled to a first and a second output end of the amplifier, respectively. The swap circuitry is configured to couple the first and second output ends of the DAC to a first and a second input end of the amplifier in a normal state, respectively, and couple the first and second output ends of the DAC to the second and first input ends of the amplifier in a swapped state, respectively.

An embodiment of the invention provides a calibration method performed by an electronic device. The electronic device includes a DAC, a TX FE coupled to the DAC, an amplifier, and an ADC coupled to the amplifier. The method includes: coupling a first and a second output end of the DAC to a first and a second input end of the amplifier, respectively; providing the DAC with a specific digital value and obtaining a first digital value from the ADC; coupling the first and second output ends of the DAC to the second and first input ends of the amplifier, respectively; providing the DAC with the specific digital value and obtaining a second digital value from the ADC; and calibrating a DC offset of the electronic device according to the first and second digital values.

An embodiment of the invention provides an electronic device. The electronic device includes a transmission path, a receiving path, and a switching circuitry. The switching circuitry is coupled to the transmission path and the receiving path. When the electronic device is in a normal mode, the switching circuitry disconnects the transmission path and the receiving path from each other. When the electronic device is in a TX DC offset determination mode, the switching circuitry couples a baseband section of the transmission path to a baseband section of the receiving path to form a baseband loop.

Other features of the present invention will be apparent from the accompanying drawings and from the detailed description which follows.

BRIEF DESCRIPTION OF THE DRAWINGS

The invention is fully illustrated by the subsequent detailed description and the accompanying drawings, in which like references indicate similar elements.

DETAILED DESCRIPTION

Figure 1:
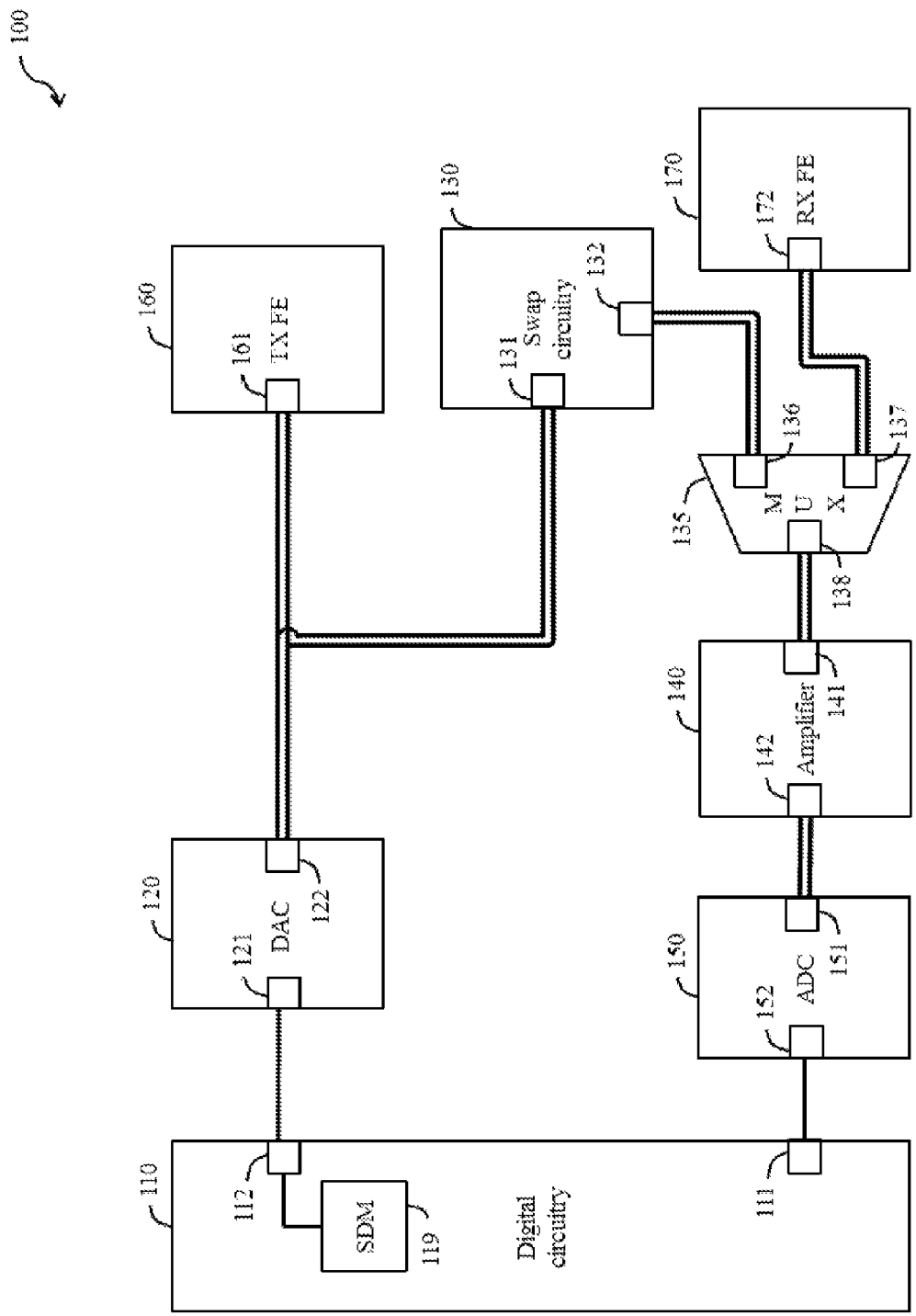
FIG. 1 shows a simplified block diagram of an electronic device according to an embodiment of the invention.

FIG. 1 shows a simplified block diagram of an electronic device according to an embodiment of the invention. One of the characteristics of this electronic device 100 is that it can communicate with another electronic device. To name a few examples, this electronic device 100 may be a mobile phone, a tablet computer, a laptop computer, a media player, or a wireless access point (AP). In this embodiment, the electronic device 100 includes at least a digital circuitry 110, a digital-to-analog converter (DAC) 120, a swap circuitry 130, a multiplexer (MUX) 135, an amplifier 140, an analog-to-digital converter (ADC) 150, a transmitter front-end (TX FE) 160, and a receiver front-end (RX FE) 170. To avoid distraction, other components of the electronic device 100 are omitted from FIG. 1.

The digital circuitry 110 may be a baseband circuitry and has an output end 112 and an input end 111. The output end 112 may output a digital signal generated by a sigma-delta modulator (SDM) 119 of the digital circuitry 110. Specifically, the SDM 119 may perform sigma-delta modulation to generate the digital signal to be fed into the DAC 120. By performing sigma-delta modulation, equivalently the SDM 119 may increase the DAC 120's resolution. Please note that the SDM 119 may be omitted in another embodiment of the invention.

The DAC 120 and the TX FE 160 may be referred to as a transmission path, in which the DAC 120 may be referred to as a baseband section. The RX FE 170, the amplifier 140, and the ADC 150 may be referred to as a receiving path, in which the amplifier 140 and the ADC 150 may be referred to as a baseband section. The electronic device 100 may have other transmission path(s) and/or other receiving path(s) not depicted in FIG. 1. The swap circuitry 130 and the MUX 135 may be referred to as a switching circuitry.

The DAC 120 has an input end 121 and a pair of output ends 122. The input end 121 is coupled to the digital circuitry 110's output end 112. The TX FE 160 has a pair of input ends 161, which are coupled to the DAC's output ends 122, respectively. The swap circuitry 130 has a pair of input ends 131 and a pair of output ends 132. The input ends 131 are coupled to the DAC 120's output ends 122, respectively. The RX FE 170 has a pair of output ends 172. The MUX 135 has a first pair of input ends 136, a second pair of input ends 137, and a pair of output ends 138. The first input ends 136 are coupled to the swap circuitry 130's output ends 132, respectively. The second input ends 137 are coupled to the RX FE 170's output ends 172, respectively. The amplifier 140 is a differential one and has a pair of input ends 141 and a pair of output ends 142. The input ends 141 are coupled to the MUX 135's output ends 138, respectively. The ADC 150 has a pair of input ends 151 and an output end 152. The input ends 151 are coupled to the amplifier 140's output ends 142, respectively. The output end 152 is coupled to the digital circuitry 110's input end 111.

The TX FE 160 may include the following components: a first local oscillator (LO) for generating a first carrier signal; a first mixer for generating a first radio frequency (RF) signal by mixing a first baseband signal provided by the DAC 120 with the first carrier signal; and a programmable gain amplifier (PGA) for amplifying the first RF signal. The amplified first RF signal may then be passed to an antenna of the electronic device 100 for transmission. The RX FE 170 may include the following components: a second local oscillator (LO) for generating a second carrier signal, a low noise amplifier (LNA) for amplifying a second RF signal received by an antenna of the electronic device 100, a second mixer for generating a second baseband signal by mixing the amplified second RF signal with the second carrier signal. The second baseband signal may then be passed to the amplifier 140. The amplifier 140 may be a programmable gain amplifier (PGA) or an amplifier with a high gain, and may serve as an integrator when the electronic device 100 is determining a DC offset on its transmission path. The electronic device 100 may further include a TX filter that filters the first baseband signal before this signal enters the TX FE 160 and/or the swap circuitry 130, and an RX filter that filters the second baseband signal before this signal enters the MUX 135.

The MUX 135 allows some of the electronic device 100's components to be shared by multiple modes. For example, the electronic device 100 may have a normal mode and a TX DC offset determination mode, and the amplifier 140 and the ADC 150 may be shared by these two modes. When the electronic device 100 is in the normal mode, the MUX 135 may connect the RX FE 170 to the amplifier 140. In this mode, the RX FE 170, the amplifier 140, and the ADC 150 may function as a receiving path (e.g. an I-path or a Q-path) of the electronic device 100. Furthermore, the DAC 120 and the TX FE 160 may function as a transmission path (e.g. an I-path or a Q-path) of the electronic device 100. The receiving path and the transmission path, which the MUX 135 disconnects from each other, allow the electronic device 100 to communicate with another electronic device, such as a base station or a wireless AP. Theoretically, when the electronic device 100 is in the normal mode, the swap circuitry 130 won't affect the electronic device 100's operations, and it's irrelevant whether the swap circuitry 130 is in a normal or a swapped state.

When the electronic device 100 is in the TX DC offset determination mode, the MUX 135 may connect the swap circuitry 130 to the amplifier 140. In this mode, the DAC 120, the swap circuitry 130, the MUX 135, the amplifier 140, and the ADC 150 may form a baseband loop of the electronic device 100. Because signals conveyed in this loop are in the baseband domain and do not enter the RF domain, it may be said that the electronic device 100 has a baseband loopback configuration when it is in the TX DC offset determination mode.

Figure 2:
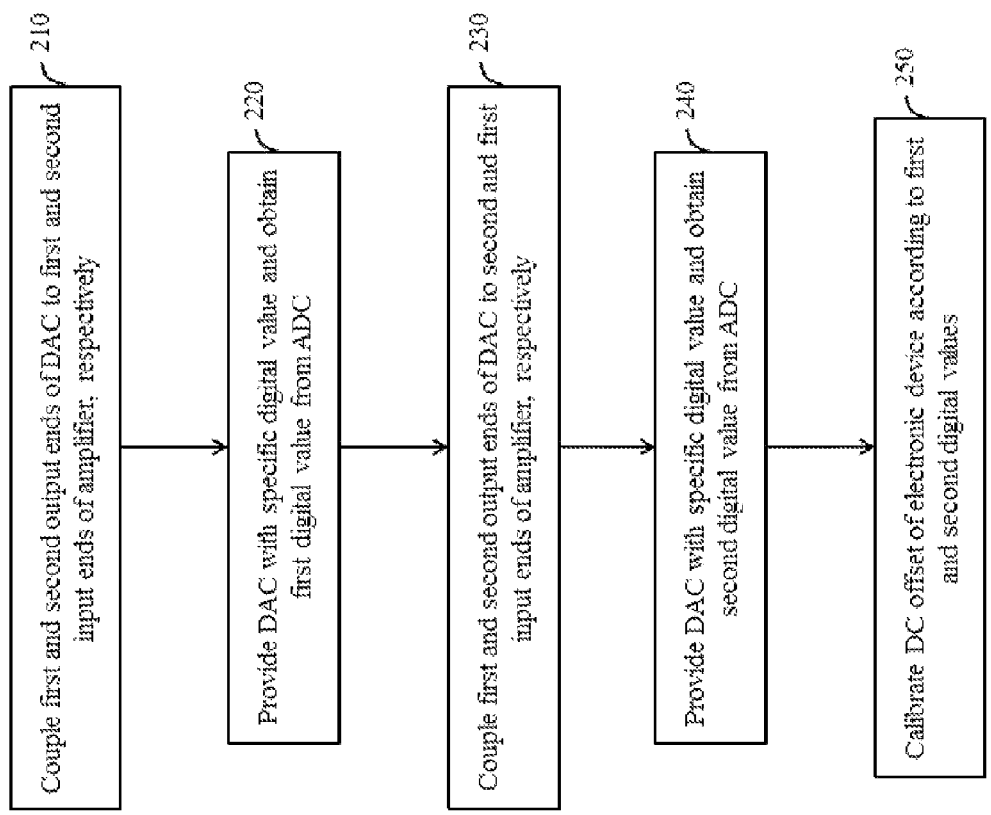
FIG. 2 shows a flowchart of a calibration method performed by the electronic device of FIG. 1.
Figure 3:
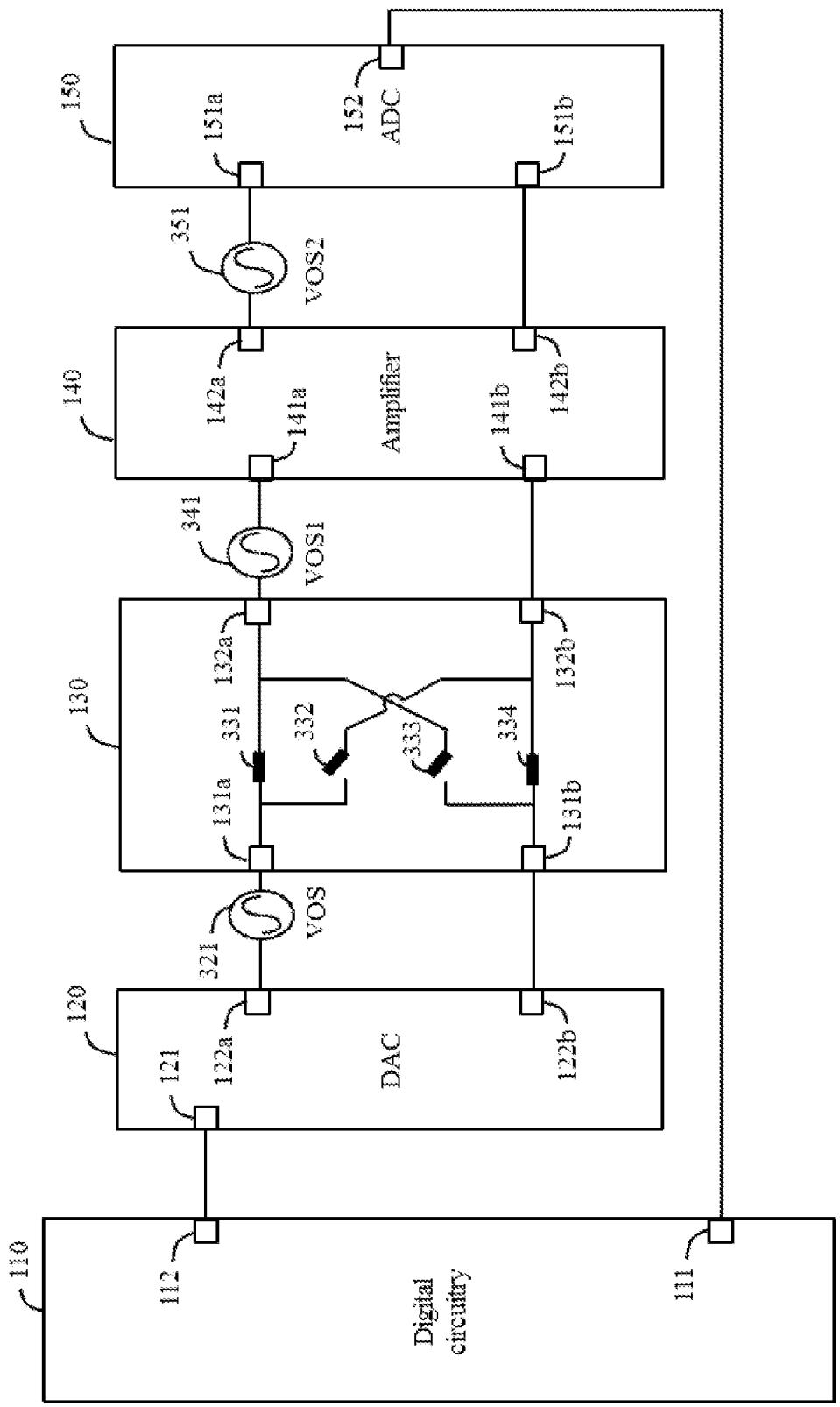
FIG. 3 and FIG. 4 show two schematic diagrams of the electronic device of FIG. 1 in a TX DC offset determination mode.
Figure 4:
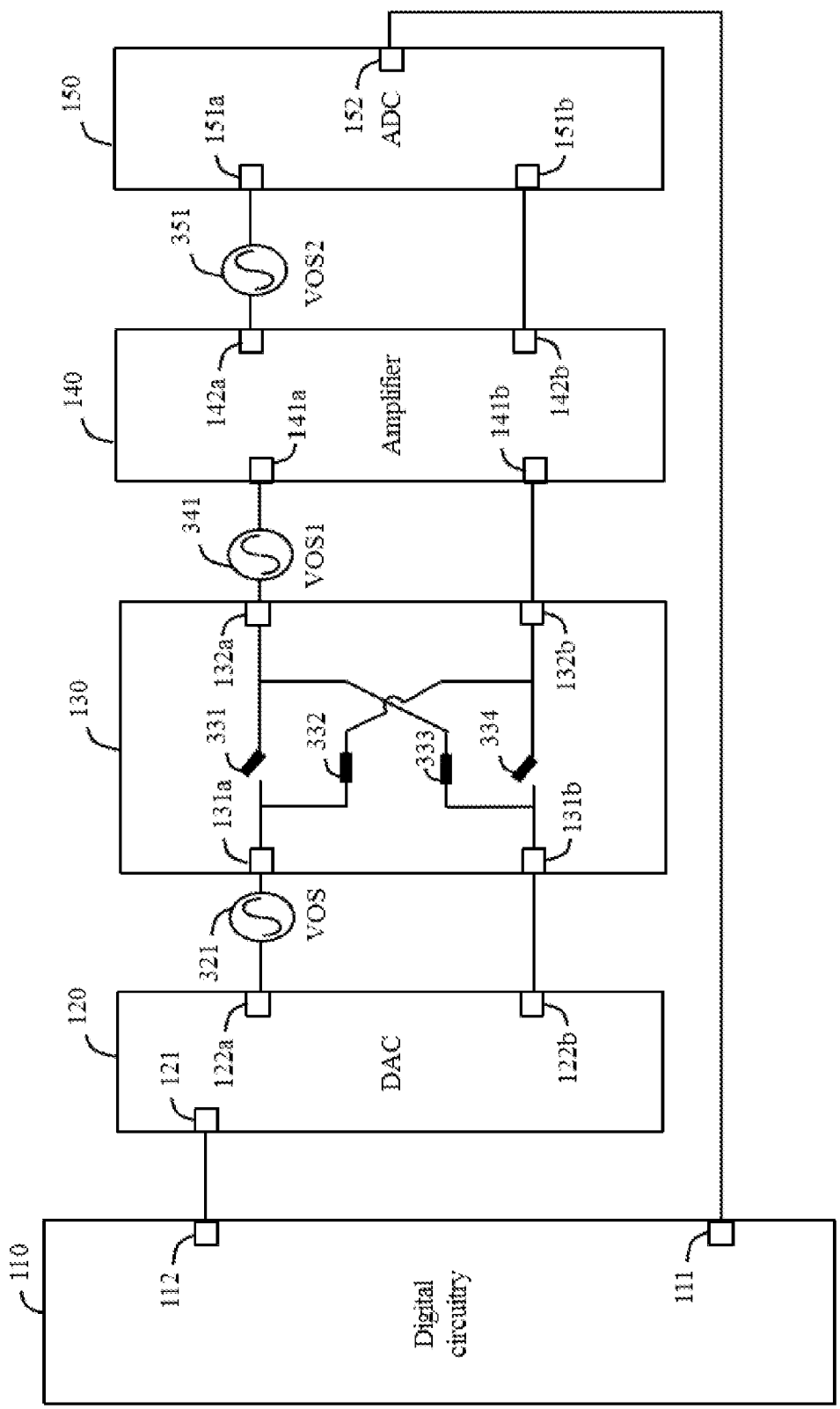

FIG. 2 shows a flowchart of a calibration method performed by the electronic device 100. FIG. 3 and FIG. 4 show two schematic diagrams of the electronic device 100 when it is in the TX DC offset determination mode. To avoid distraction, the MUX 135, the TX FE 160, and the RX FE 170 are omitted from these two figures. These two figures further indicate that the swap circuitry 130 may include four switches 331, 332, 333, and 334. The switch 331 may couple the swap circuitry 130's first input end 131a and first output end 132a; the switch 332 may couple the swap circuitry 130's first input end 131a and second output end 132b; the switch 333 may couple the swap circuitry 130's second input end 131b and first output end 132a; the switch 334 may couple the swap circuitry 130's second input end 131b and second output end 132b. In FIG. 3, the swap circuitry 130 is in a normal state; in FIG. 4, the swap circuitry 130 is in a swapped state. Moreover, FIG. 3 and FIG. 4 further show three voltage sources 321, 341, and 351. These three voltage sources are not actual circuit components but are only used to represent the equivalent DC offsets on various locations in the electronic device 100's baseband domain.

Steps 210, 220, 230, and 240 are performed when the electronic device 100 is in the TX DC offset determination mode. As mentioned, when the electronic device 100 is in this mode, the swap circuitry 130 may be in the normal state or the swapped state. Because the RX FE 170 is not using the amplifier 140 and the ADC 150, the amplifier 140 and the ADC 150 are available and may be used to determine a DC offset on the electronic device 100's transmission path.

At step 210, the swap circuitry 130 and the MUX 135 couples the first output end 122a and second output end 122b of the DAC 120 to the first input end 141a and second input end 141b of the amplifier 140, respectively. Then, at step 220, the digital circuitry 110 provides the DAC 120 with a specific digital value and obtains a first digital value D1 from the ADC 150. As FIG. 3 indicates, at steps 210 and 220, the swap circuitry 130 is in the normal state; the switches 331 and 334 are on and the switches 332 and 333 are off.

Because the differential lines shown in FIG. 3 may have DC offsets VOS, VOS1, and VOS2, the first digital value D1 may be a non-zero value even when the specific digital value represents zero. Specifically, when the specific digital value represents zero, the first digital value D1 may be proportional to VOS+VOS1+(VOS2/G), where G is the gain of the amplifier 140. Because G may be relatively large, the relatively small term (VOS2/G) may be neglected.

At step 230, the swap circuitry 130 and the MUX 135 couples the first output end 122a and second output end 122b of the DAC 120 to the second input end 141b and first input end 141a of the amplifier 140, respectively. Then, at step 240, the digital circuitry 110 provides the DAC 120 with the specific digital value and obtains a second digital value D2 from the ADC 150. As FIG. 4 indicates, at steps 230 and 240, the swap circuitry 130 is in the swapped state; the switches 331 and 334 are off and the switches 332 and 333 are on.

Because of the DC offsets VOS, VOS1, and VOS2, the second digital value D2 may be a non-zero value even when the specific digital value represents zero. Specifically, when the specific digital value represents zero, the second digital value D2 may be proportional to −VOS+VOS1+(VOS2/G). Because G may be relatively large, the relatively small term (VOS2/G) may be neglected.

Step 250 is performed when the electronic device 100 is in the normal mode. When the electronic device 100 is in this mode, the DAC 120 and the TX FE 160 may serve as a transmission path of the electronic device 100. At step 250, the digital circuitry 110 calibrates the DC offset VOS of the electronic device 100 according to the first and second digital values D1 and D2. For example, if the specific digital value represents zero, the digital circuitry 110 may obtain a third digital value D3 by subtracting D2 from D1, and the third digital value D3 may be proportional to VOS and substantially unrelated to VOS1 and VOS2. Based on the digital value D3, the digital circuitry 110 may calibrate the DC offset VOS in the digital domain. For example, the digital circuitry 110 may add an offset value to each digital value it sends to the DAC 120 to nullify the DC offset VOS. The offset value may be proportional to −D3. Without being affected by the DC offset VOS, the transmission path (i.e. the DAC 120 and the TX FE 160) may better maintain its reliable performance.

The TX DC offset calibration scheme has several advantages. When the electronic device 100 is in the TX DC offset determination mode, the differential signal generated by the DAC 120 is directly looped back to the amplifier 140 by the swap circuitry 130 and the MUX 135 without entering the RF domain. This baseband loopback configuration makes the aforementioned DC offset calibration process relatively less time-consuming. Furthermore, this configuration alleviates some precision requirements on the ADC 150. Specifically, the digital circuitry 110 can nullify the DC offset VOS precisely even if the ADC 150 does not have a high resolution. Moreover, the electronic device 100 allows the amplifier 140 and the ADC 150, which may be on a receiving path, to be reused in the TX DC offset determination mode. As a result, aside from some additional hardware costs associated with the swap circuitry 130 and the MUX 135, the embodiment may help save hardware costs. In addition, the TX DC offset calibration may be performed when the electronic device 100 is already in an end-user' hand. This may allow the electronic device 100 to maintain good communication quality even after it has left its manufacturer/vender.

In the foregoing detailed description, the invention has been described with reference to specific exemplary embodiments thereof. It will be evident that various modifications may be made thereto without departing from the spirit and scope of the invention as set forth in the following claims. The detailed description and drawings are, accordingly, to be regarded in an illustrative sense rather than a restrictive sense.

What is claimed is:

1. An electronic device, comprising:
   a digital-to-analog converter (DAC), having a first output end and a second output end;
   a transmitter front-end (TX FE), having a first input end and a second input end coupled to the first and second output ends of the DAC, respectively;
   an amplifier, having a first input end, a second input end, a first output end, and a second output end;
   an analog-to-digital converter (ADC), having a first input end and a second input end coupled to the first and second output ends of the amplifier, respectively; and
   a swap circuitry, configured to couple the first and second output ends of the DAC to the first and second input ends of the amplifier in a normal state, respectively, and couple the first and second output ends of the DAC to the second and first input ends of the amplifier in a swapped state, respectively.

2. The electronic device of claim 1, further comprising:
   a receiver front-end (RX FE), having a first output end and a second output end;
   a multiplexer, configured to couple the first and second output ends of the RX FE to the first and second input ends of the amplifier, respectively, when the electronic device is in a normal mode, and couple a first output end and a second output end of the swap circuitry to the first and second input ends of the amplifier, respectively, when the electronic device is in a TX DC offset determination mode.

3. The electronic device of claim 1, further comprising a digital circuitry coupled to an input end of the DAC and an output end of the ADC, wherein the digital circuitry is configured to:
   provide the DAC with a specific digital value when the swap circuitry is in the normal state and obtain a first digital value from the ADC;
   provide the DAC with the specific digital value when the swap circuitry is in the swapped state and obtain a second digital value from the ADC; and
   calibrate a DC offset of the electronic device according to the first and second digital values.

4. The electronic device of claim 3, wherein the digital circuitry comprises:
   a sigma-delta modulator (SDM), having an output end coupled to the input end of the DAC.

5. A calibration method performed by an electronic device, the electronic device comprising a digital-to-analog converter (DAC), a transmitter front-end (TX FE) coupled to the DAC, an amplifier, and an analog-to-digital converter (ADC) coupled to the amplifier, the method comprising:
   coupling a first and a second output end of the DAC to a first and a second input end of the amplifier, respectively;
   providing the DAC with a specific digital value and obtaining a first digital value from the ADC;
   coupling the first and second output ends of the DAC to the second and first input ends of the amplifier, respectively;
   providing the DAC with the specific digital value and obtaining a second digital value from the ADC; and
   calibrating a TX DC offset of the electronic device according to the first and second digital values.

6. The method of claim 5, wherein the electronic device further comprises a swap circuitry, and the method further comprises:
   configuring the swap circuitry to couple the first and second output ends of the DAC to the first and second input ends of the amplifier in a normal state, respectively, and couple the first and second output ends of the DAC to the second and first input ends of the amplifier in a swapped state, respectively.

7. The method of claim 6, wherein the electronic device further comprises a receiver front-end (RX FE), and the method further comprises:
   coupling a first and a second output end of the RX FE to the first and second input ends of the amplifier, respectively, when the electronic device is in a normal mode.

8. The method of claim 5, further comprising:
   performing sigma-delta modulation to generate a digital signal to an input end of the DAC.

9. An electronic device, comprising:
   a transmission path;
   a receiving path; and
   a switching circuitry, coupled to the transmission path and the receiving path, configured to:
     disconnect the transmission path and the receiving path when the electronic device is in a normal mode; and
     couple a baseband section of the transmission path to a baseband section of the receiving path to form a baseband loop when the electronic device is in a TX DC offset determination mode.

10. The electronic device of claim 9, wherein the baseband section of the transmission path comprises a digital-to-analog converter (DAC), and the baseband section of the receiving path comprises an amplifier and an analog-to-digital converter (ADC) coupled to the amplifier.

11. The electronic device of claim 10, wherein the switching circuitry comprises:
  a swap circuitry, configured to couple a first and a second output end of the DAC to a first and a second input end of the amplifier in a normal state, respectively, and couple the first and second output ends of the DAC to the second and first input ends of the amplifier in a swapped state, respectively.

12. The electronic device of claim 11, wherein the receiving path further comprises a receiver front-end (RX FE), and the switching circuitry further comprises:
  a multiplexer, configured to couple a first and a second output end of the RX FE to the first and second input ends of the amplifier, respectively, when the electronic device in a normal mode, and couple a first and a second output end of the swap circuitry to the first and second input ends of the amplifier, respectively, when the electronic device is in a TX DC offset determination mode.

13. The electronic device of claim 11, further comprising a digital circuitry coupled to an input end of the DAC and an output end of the ADC, wherein the digital circuitry is configured to:
  provide the DAC with a specific digital value when the swap circuitry is in the normal state and obtain a first digital value from the ADC;
  provide the DAC with the specific digital value when the swap circuitry is in the swapped state and obtain a second digital value from the ADC; and
  calibrate a DC offset of the electronic device according to the first and second digital values.

14. The electronic device of claim 13, wherein the digital circuitry comprises:
  a sigma-delta modulator (SDM), having an output end coupled to the input end of the DAC.

* * * * *